United States Patent
Debono et al.

(10) Patent No.: US 8,521,478 B2
(45) Date of Patent: Aug. 27, 2013

(54) AUTOMATIC COLORING OF RIGID GROUPS OF PARTS

(75) Inventors: Maxime Debono, Lyons (FR); David Lagrange, Le Coteau (FR); Jean-Yves Machillot, Pouilly-les-Nonains (FR); Peter Legate Maxfield, Portland, OR (US); Gerard Saignavong, Roanne (FR); Frederic Tachet, Saint Léger-sur-Roanne (FR)

(73) Assignee: Autodesk, Inc., San Rafael, CA (US)

( * ) Notice: Subject to any disclaimer, the term of this patent is extended or adjusted under 35 U.S.C. 154(b) by 1019 days.

(21) Appl. No.: 12/060,826

(22) Filed: Apr. 1, 2008

(65) Prior Publication Data

US 2009/0248369 A1    Oct. 1, 2009

(51) Int. Cl.
    *G06F 17/50*    (2006.01)
(52) U.S. Cl.
    USPC ............................................................ 703/1
(58) Field of Classification Search
    USPC ............................................................ 703/1
    See application file for complete search history.

(56) References Cited

U.S. PATENT DOCUMENTS

| | | | |
|---|---|---|---|
| 5,410,496 A * | 4/1995 | Bolon et al. | 703/7 |
| 5,452,238 A * | 9/1995 | Kramer et al. | 703/1 |
| 5,687,304 A | 11/1997 | Kiss | |
| 5,696,892 A | 12/1997 | Redmann et al. | |
| 5,710,878 A | 1/1998 | McCoy et al. | |
| 5,886,701 A | 3/1999 | Chauvin et al. | |
| 6,456,288 B1 | 9/2002 | Brockway et al. | |
| 6,867,781 B1 | 3/2005 | Van Hook et al. | |
| 7,701,461 B2 | 4/2010 | Fouladi et al. | |
| 2003/0050871 A1 * | 3/2003 | Broughton | 705/28 |
| 2005/0088447 A1 | 4/2005 | Hanggie et al. | |
| 2005/0091628 A1 * | 4/2005 | Kragh et al. | 716/13 |
| 2009/0222469 A1 | 9/2009 | Maillot et al. | |
| 2009/0251478 A1 | 10/2009 | Maillot et al. | |

OTHER PUBLICATIONS

Alf Yarwood, "Introduction to AutoCAD 2008: 2D and 3D Design", 2007, Newnes, pp. 75, 302, 303, 312.*
Matt Lombard, "Solidworks 2007 Bible", 2007, John Wiley & Sons, pp. 100, 101, 944, 1024.*
Rusty Gesner et al., "Inside AutoCAD Release 12 for Windows", 1993, New Riders Publishing, pp. 147, 148, 312, 313, 378-380.*
Joe Sutphin, "AutoCAD 2006 VBA A Programmer's Reference", 2005, Apress, pp. 205-229.*
"Unofficial Help Page about SolidDesigner—LISP programs for 3D, section Color Parts Randomly", Aug. 2007, pp. 1-8.*

(Continued)

*Primary Examiner* — Dwin M Craig
*Assistant Examiner* — Russ Guill
(74) *Attorney, Agent, or Firm* — Patterson & Sheridan, L.L.P.

(57) ABSTRACT

One embodiment of the invention sets forth a CAD application configured to receive an instruction to process a first rigid body in a CAD model and to create a graphic style table that includes a listing of available graphic styles to apply to the rigid bodies in the CAD model. The CAD application is further configured to analyze assembly data associated with the first rigid body to determine if the first rigid body includes any user-defined characteristics. The CAD application is configured to select a first graphic style and apply the first graphic style to each of the geometric bodies included in the first rigid body. Advantageously, embodiments of the invention provide users with a better visual understanding of each rigid body in an assembly and the dynamic relationships between those rigid bodies.

14 Claims, 8 Drawing Sheets

(56) References Cited

OTHER PUBLICATIONS

Jianjun Oung, "Design and implementation of an object-oriented geometric constraint solver", 2001, University of Florida, pp. 1-82.*

Terrence Fernando et al., "Software Architecture for a Constraint-based Virtual Environment," 1999, Proceedings of VRST, pp. 1-13.*

Glenn A. Kramer, "Solving geometric constraint systems," 1992, Massachusetts Institute of Technology, pp. vii, 101-104.*

George Omura, "Just Enough AutoCAD 2006," 2005, Sybex, p. 216.*

Office Action, U.S. Appl. No. 12/040,659 dated Feb. 10, 2011.

Office Action in U.S. Appl. No. 12/099,753 mailed Mar. 2, 2011.

* cited by examiner

AUTOMATIC COLORING OF RIGID GROUPS OF PARTS

BACKGROUND OF THE INVENTION

1. Field of the Invention

The present invention generally relates to computer software. More specifically, the present invention relates to a CAD application configured to automatically color each rigid group of parts in a CAD model.

2. Description of the Related Art

The term computer aided design (CAD) refers to a broad variety of computer-based tools used by architects, engineers, animators, video game designers, and other graphics and design professionals. CAD applications may be used to construct computer models or drawings representing virtually any imaginable two-dimensional (2D) or three-dimensional (3D) construct. A rendering application may then be used to generate an image from a CAD model. Rendering is also used to describe the process of calculating effects in a video editing file to produce a final video output.

A mechanical modeling program may be part of the CAD application. Mechanical modeling programs allow users to interactively create and position geometric bodies relative to each other in a mechanical model. Such programs are used, among other things, to model the kinematic relationships between different geometric bodies. These kinematic relationships are usually inferred by constraints applied to individual (or sets of) geometric bodies. A constraint removes or limits one or more degrees of freedom of movement of one geometric body (or group of geometric bodies) in relation to another geometric body (or group of geometric bodies) within the mechanical model. For example, a piston head geometric body can be constrained so that the motion of the piston head is limited to movement along the direction of a cylinder axis of an engine geometric body. Such kinematic relationships allow designers to understand how parts fit together and move in relation to one another.

Dynamic simulation, another common feature of CAD applications, is used to apply load and motion histories to mechanical models so that users understand the behavior (e.g., accelerations, velocities, displacements) of modeled bodies. Unlike kinematics, where motion-based relationships between different geometric bodies are defined by inter-element constraints, dynamic simulation requires that degree of freedom relationships be defined at the "joints" where geometric bodies (or groups of geometric bodies) connect. In typical CAD applications, users are required to manually convert kinematic constraints into joints for dynamic simulation purposes. This process commonly entails deleting constraints from the model and adding joints to the model. A first problem with this approach is that the process is labor intensive and error prone. A second problem is that the process introduces a number of redundant constraints that can undermine the performance of a dynamic simulation.

To address these problems, some CAD applications semi-automatically translate constraints into joints. However, these applications still require some user input. An additional problem is that these systems do not necessarily associate a given constraint with its respective joint. Thus, a change to a constraint in an assembly view is not automatically reflected in the respective joint in a dynamic simulation view.

More advanced CAD applications address the above problems by implementing a software engine that automatically determines the constraints between different geometric bodies in a mechanical model and to generate different rigid bodies in a dynamic simulation view. These systems still have certain drawbacks, however. Specifically, from a user's perspective, the models generated by these advanced CAD applications are visually organized with respect to geometric bodies or sub-assemblies; the dynamic relationships between the different rigid bodies in the models are not apparent to the end-user. This failure limits the usefulness of the dynamic simulations to the end-user.

Accordingly, there remains a need in the art for technique to organize and display the dynamic relationships between the different elements in a CAD model that is more useful to end-users.

SUMMARY OF THE INVENTION

Embodiments of the invention provide a method for delineating rigid bodies in a CAD model. The CAD application receives an instruction to process a first rigid body in the CAD model and creates a graphic style table that includes a listing of available graphic styles to apply to the rigid bodies in the CAD model. The CAD application analyzes assembly data associated with the first rigid body to determine if the first rigid body includes any user-defined characteristics. The CAD application selects a first graphic style and applies the first graphic style to each of the geometric bodies included in the first rigid body.

One advantage of the disclosed method is that it provides a better visual understanding of each rigid body in an assembly and the dynamic relationships between those rigid bodies. A second advantage is that a user may adjust any of the color choices for a component of a rigid body in an assembly browser, and the adjustment is respected when the design is re-analyzed in a dynamic simulation browser.

DETAILED DESCRIPTION OF THE PREFERRED EMBODIMENTS

Figure 1:
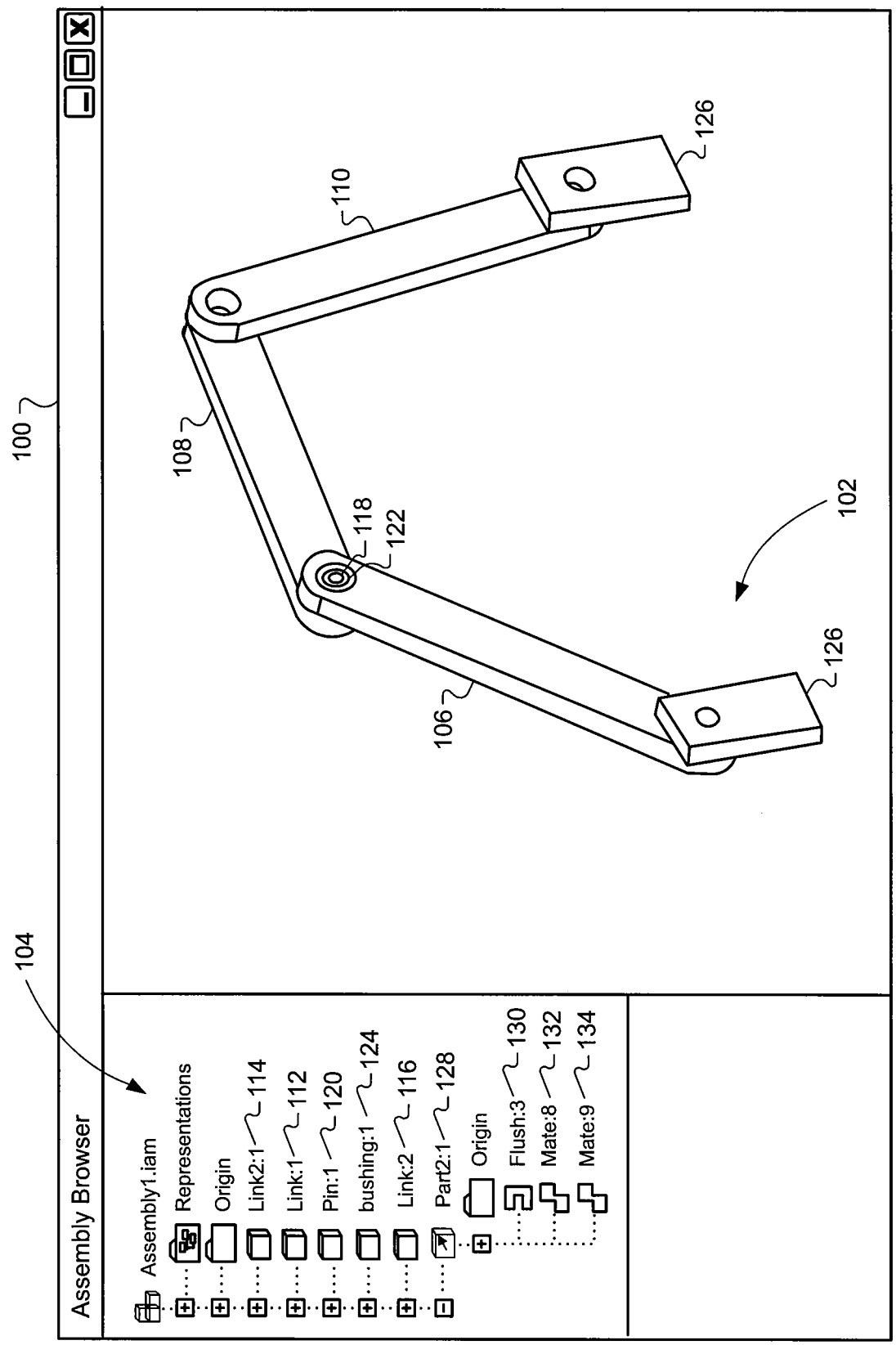
FIG. 1 is screen shot illustrating a graphical user interface for an assembly browser of a CAD application, according to one embodiment of the invention.

FIG. 1 is screen shot illustrating a graphical user interface for an assembly browser 100 of a CAD application, according to one embodiment of the invention. As shown, the assembly browser 100 presents a view of an assembly 102, such as a linkage, and optionally includes a hierarchical representation 104 of the assembly 102. The elements in the hierarchical representation 104 correspond to elements in the assembly 102. For example, link bodies 106, 108, and 110, correspond to elements 112, 114, and 116, respectively, in the hierarchical representation 104. A pin 118 is a cylindrical body that is constrained to be in contact with the link body 106. The pin 118 corresponds to element 120 in the hierarchical representation 104. A bushing body 122 is a cylindrical body with a concentric hole that is constrained to be in contact with link 108. The bushing body corresponds to element 124 in the hierarchical representation 104. Two rectangular pieces make up a grounded body 126. Grounded bodies are bodies that are not free to move relative to a "world" view of the model. The grounded body 126 corresponds to element 128 in the hierarchical representation 104.

The assembly browser 100 includes functionality to allow users to create and modify geometric bodies and constraints between geometric bodies. As described herein, a "geometric body" is a part or collection of parts that move together, i.e., a rigid mass that is geometrically and kinematically connected. Bodies can have planes, axes, holes, interior surfaces and other characteristics. An "assembly" is a collection of geometric bodies in a model.

In general, the assembly browser 100 assumes that all geometric bodies in a model are initially unconstrained. No limitations are placed on movement until constraints are added. As constraints are added, the assembly 102 becomes more rigid. Constraints relate geometric bodies to one another and a geometric body can be constrained relative to one or more other geometric bodies in a model. A constraint removes or limits one or more degrees of freedom for a given geometric body (or group of geometric bodies) in relation to another geometric body (or group of geometric bodies). A geometric body can have up to six open degrees of freedom: a geometric body can be free to rotate around up to three axes (i.e., x, y, and z) and move in up to three directions (i.e., x, y, and z). As constraints are added between two geometric bodies, the geometric bodies have fewer degrees of freedom in relation to one another. Constraints can be specified using planes, axes, faces, and other characteristics of geometric bodies. For example, a piston head can be constrained so that the motion of the piston is constrained to be along the direction of an engine cylinder axis.

The hierarchical representation 104 can display constraints that have been specified for an assembly 102. For example, three constraints are shown beneath element 128 and are related to the grounded body 126. A flush constraint 130 has been defined to make a face of the link 106 coincident with a face of the grounded body 126. A mate constraint 132 has been defined to make the hole of the link 106 concentric with the left hole of the grounded body 126. The constraints 130 and 132 remove some, but not all, of the degrees of freedom of the link 106 with respect to the grounded body 126. For example, the link 106 can still rotate with respect to the hole of the link 106. A second mate constraint 134 has been defined to make the hole of the link 110 concentric with the right hole of the grounded body 126.

Other constraints may be defined for other geometric bodies, but these constraints are omitted from the hierarchical representation 104 for clarity. The user can select a "plus" icon to expand an element to see the constraints associated with the element. For example, an axial constraint has been defined between link 106 and link 108. The axes of the two links have been mated together. Constraints have also been defined for the pin 118 and the bushing 122. The pin 118 is constrained to be concentric and flush with the bushing 122. The rotational degree of freedom between the pin 118 and the bushing 122 has been left open, allowing the pin and the bushing to rotate relative to one another. The bushing 122 has been constrained to rigidly fit inside the top hole of the link 106. The pin 118 has been constrained to rigidly fit into the left hole of the link 108. As is shown, geometric bodies, such as the pin 118, can be simultaneously constrained to more than one body.

Figure 2:
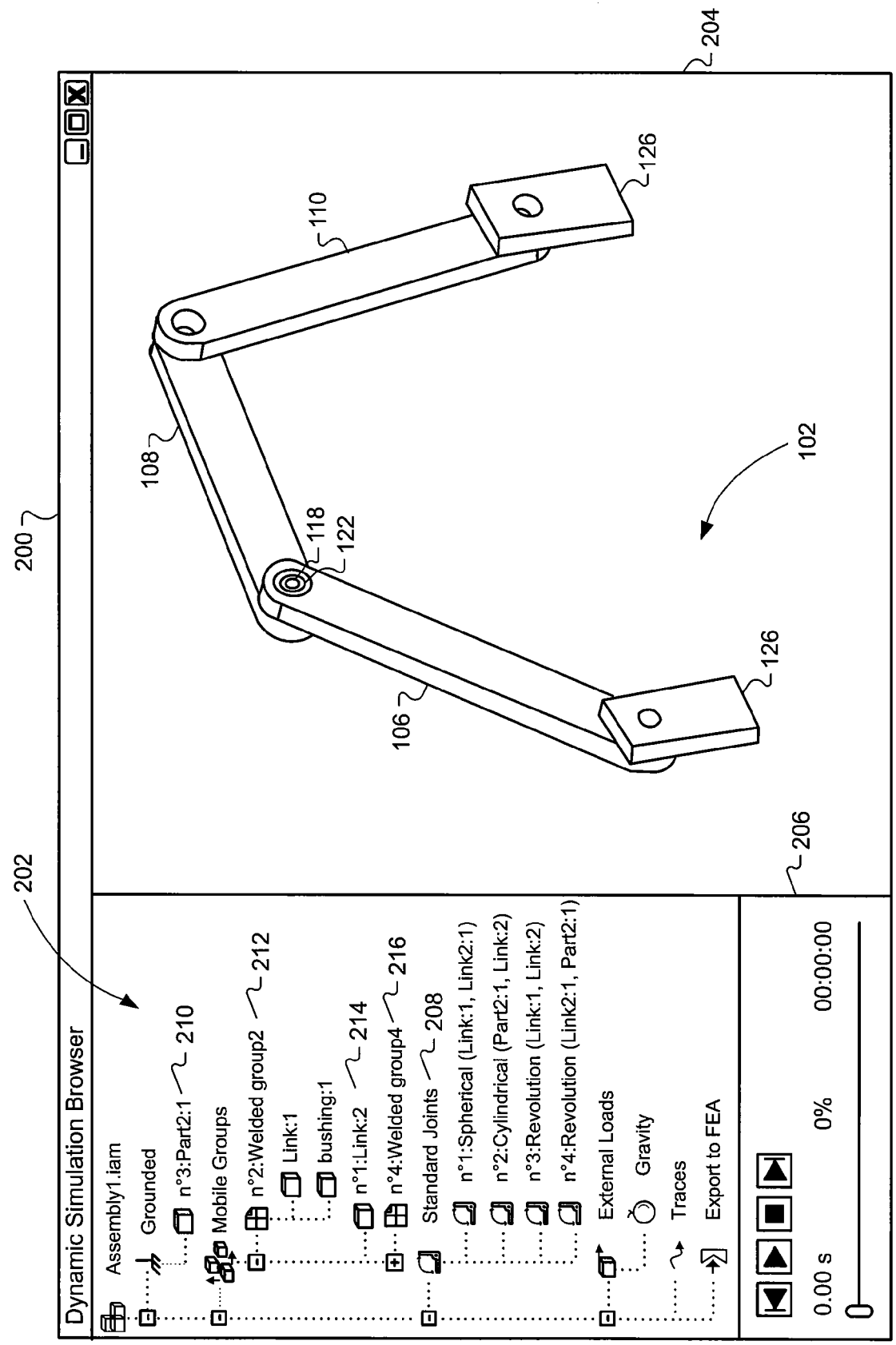
FIG. 2 is screen shot illustrating a graphical user interface for a dynamic simulation browser of a CAD application, according to one embodiment of the invention.

FIG. 2 is screen shot illustrating a graphical user interface for a dynamic simulation browser 200 of a CAD application, according to one embodiment of the invention. The dynamic simulation browser 200 assists users in understanding behaviors such as accelerations, velocities, and displacements of the different elements of the assembly 102. The dynamic simulation browser 200 can display movement simulations in which load and motion histories are applied to models. For example, a force can be applied to a geometric body and examinations can be made regarding the effects on the rest of the assembly 102. Users can control a simulation (e.g., start, stop, etc.) using an interactive simulation control panel 206.

In dynamic simulation, geometric bodies are related to one another through the use of joints. Joints dictate how geometric bodies move with respect to one another. Unlike constraints, which remove degrees of freedom, joints add degrees of freedom. In various implementations, joints are implemented with constraints. In dynamic simulations, geometric bodies are initially assumed to be rigid. As joints are added, degrees of freedom are added, making the assembly 102 more flexible. In one embodiment, the dynamic simulation browser 200 includes a hierarchical representation 202 that can display elements in the simulation such as rigid and mobile groups of bodies and degrees of freedom between them. A graphical representation of the simulation can be shown in a view pane 204.

In various embodiments, users can switch between the assembly browser 100 and the dynamic simulation browser 200 by selecting a GUI menu or by typing a key on a keyboard. An assembly 102, having geometric bodies related by constraints, may be automatically converted to rigid and mobile groups related by joints when users switch from the assembly browser 100 to the dynamic simulation browser 200.

The joints that are used in the dynamic simulation browser 200 can be inferred from the constraints specified in the assembly browser 100. A software component called a constraint reduction engine (CRE) examines the kinematic constraints within an assembly 102 and automatically determines the proper dynamic relationships between the different groups of geometric bodies in that assembly 102. The CRE converts constraints that restrict movement into those that allow movement (i.e., joints). Examples of the various conversions from constraints to joints that may be performed are shown in Table 1.

TABLE 1

| CONSTRAINT TYPE | JOINT TYPE |
| --- | --- |
| Mate Two Points | Ball Joint |
| Mate Point And A Line | Mate Point And Line Joint |
| Mate Line And Line | Cylindrical Joint |
| Mate Two Cylinders | Cylindrical Joint |
| Mate Two Spheres | Ball Joint |
| Mate Sphere And Cone | Ball Joint |
| Mate Two Cones | Revolute Joint |
| Mate Two Circles | Revolute Joint |

TABLE 1-continued

| CONSTRAINT TYPE | JOINT TYPE |
| --- | --- |
| Mate Two Planes | Planar Joint |
| Mate Point And Plane | Mate Point And Plane Joint |
| Tangent Plane Cylinder | Planar Joint |
| Translation | Translational Joint |
| Gear | Rolling Joint |
| Weldment | Weldment Joint |
| Revolute | Revolute Joint |

The hierarchical representation 202 shows a "Standard Joints" element 208 that lists several joints that were created based on kinematic constraints using the CRE. Cylindrical, revolution, and spherical joints were created automatically based on constraints in the assembly 102.

In one embodiment of the invention, there is a correlation between the groups and joints in the dynamic simulation browser 200 and the constraints in the assembly browser 100. For example, as changes are made to a model in the assembly browser 100, then the changes are automatically taken into account when defining groups and joints in the dynamic simulation browser 200.

User-specified constraints are not always optimally defined. The user may define more constraints than are necessary, resulting in redundant constraints. The CRE can, given an input of a set of geometric bodies related by constraints, produce an equivalent minimum set of geometric bodies and constraints that result in the same set of motions. Having a minimal set of geometric bodies and constraints can improve the quality, performance, and ease of use of a dynamic simulation. Examples of constraints that the CRE can reduce include: an angle between two vectors, mate a point to a spline curve, mate a point to a circle, mate a point to a surface, make two curves touch, constrain distance between two lines, constrain distance between a line and a plane, equal distance point between two planes, equal distance plane between two planes, set distance between two points, set distance between a point and a line, make two cylinders tangent, tangent cylinder and sphere, tangent sphere and sphere, tangent plane and cone, tangent cylinder and cone, tangent sphere and cone, tangent cone and cone, tangent plane and circle, tangent line and cylinder, tangent circle and circle, tangent line and sphere, tangent line and circle, tangent curve and surface, tangent surface and surface, perpendicular cur and surface, universal joint, make tangent across adjacent faces, mate two profiles, among others.

As part of CRE processing, the CRE can identify mobile and grounded groups of bodies in the model. The "grounded group" contains bodies that are not free to move during a dynamic simulation. The hierarchical representation 202 lists one grounded body 208. The grounded body 210 corresponds to the grounded body 126 of the assembly 102. In one embodiment, the user may select which components are to be grounded using GUI elements (not shown) the assembly browser 100 of FIG. 1.

"Mobile groups" are groups of geometric bodies, or combined rigid groups, that are allowed to move with respect to the grounded groups. A rigid group is a replacement for a merged group of geometric bodies. The hierarchical representation 202 shows three mobile groups. A first mobile group 212 is associated with the link 106 and the bushing 122. In one embodiment, the CRE analyzed the constraints between these two geometric bodies and determined that the two geometric bodies were rigidly connected and therefore put them into a single rigid group. A second mobile group 214 is associated with the link 110. The link 110 has no other geometric bodies rigidly constrained to the link 100, so the CRE put this geometric body into a separate mobile group. A third mobile group 216 is associated with the link 108 and the pin 118. The CRE examined the constraints between these two bodies and determined that the two geometric bodies were rigidly connected and therefore put them into a single rigid group.

In alternative embodiments, rigid bodies may be defined in any technically feasible way. For example, if an assembly has two blocks with no constraints between them, then a revolution joint may be established manually in the dynamic simulation view to create two rigid bodies. Persons skilled in the art will understand that the manner in which rigid bodies are defined in no way limits the scope of the present invention.

Figure 3:
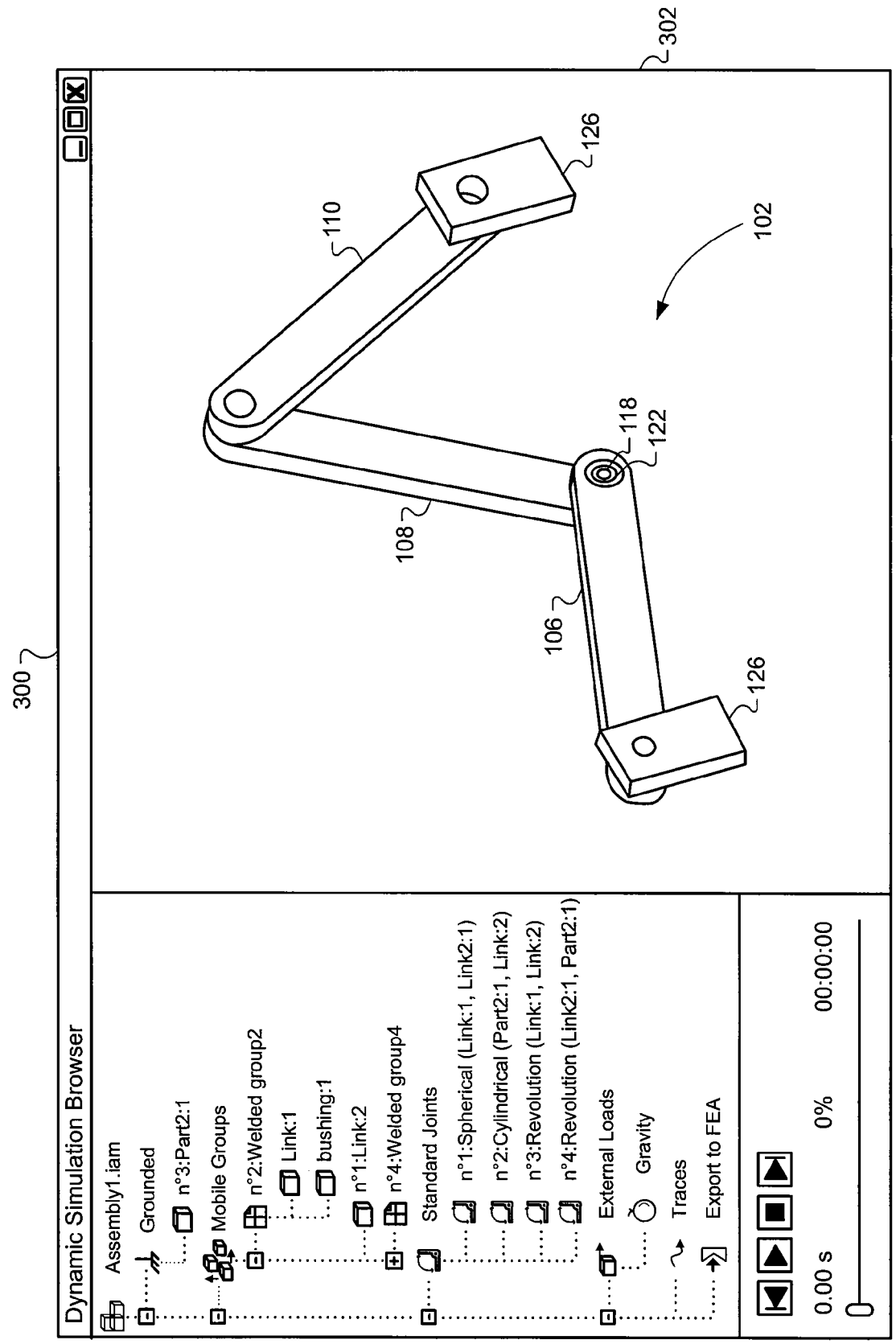
FIG. 3 is screen shot illustrating a graphical user interface for a dynamic simulation browser of a CAD application after a motion simulation, according to one embodiment of the invention.

FIG. 3 is screen shot illustrating a graphical user interface for a dynamic simulation browser 300 of a CAD application after a motion simulation, according to one embodiment of the invention. As mentioned above, dynamic simulation can involve the application of loads and motion histories to models. The simulation browser 300 shows an assembly 102 after loads and motion histories have been applied to the assembly 102 shown in the dynamic simulation browser 200. A view panel 302 shows a graphical representation of how the applied loads and motions affected the assembly 102. The bodies in the grounded group (i.e., 126) have not moved, whereas the bodies in the mobile groups (i.e., 106, 108, 110, 118, and 122) have changed position relative to the grounded groups.

Figure 4:
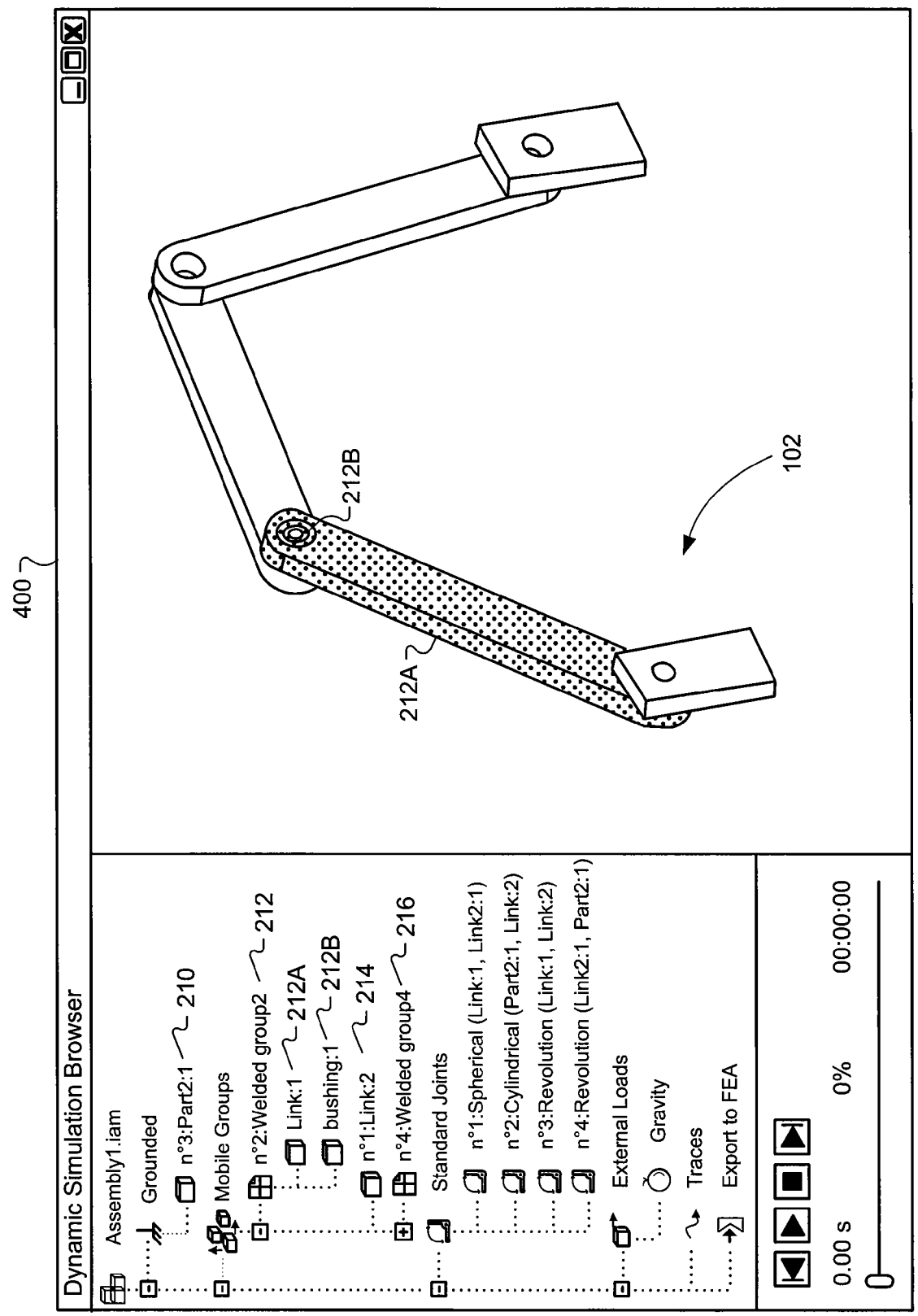
FIG. 4 is screen shot illustrating a graphical user interface for a dynamic simulation browser of a CAD application where a graphic style has been assigned to a rigid body, according to one embodiment of the invention.

FIG. 4 is screen shot illustrating a graphical user interface for a dynamic simulation browser 400 of a CAD application, where a graphic style has been assigned to a rigid body, according to one embodiment of the invention. In one embodiment, a user selects a color or graphics style from a list of available colors or graphics styles to apply to a particular rigid body in the assembly 102. In alternative embodiments, the user may select the color from a color wheel or select the color by inputting numerical RGB or CMYK values into a color GUI (not shown). Here, the user has selected a polka dot graphics style and applied the polka dot graphics style to mobile group 212. The color or graphic style is conveniently applied in a single command to each of the geometric bodies (or components) that comprise the particular rigid body. As shown, mobile group 212 includes link 212A and pin 212B. Thus, the polka dot graphics style is applied to link 212A and pin 212B when the user applies the graphic style to mobile group 212. The other mobile groups 210, 214, 216 do not receive the polka dot graphic style. By contrast, in prior art systems, the user is unable to apply an entire color or graphic style designation to an entire rigid body in one command and is forced to manually select each component of a particular rigid body separately.

Figure 5:
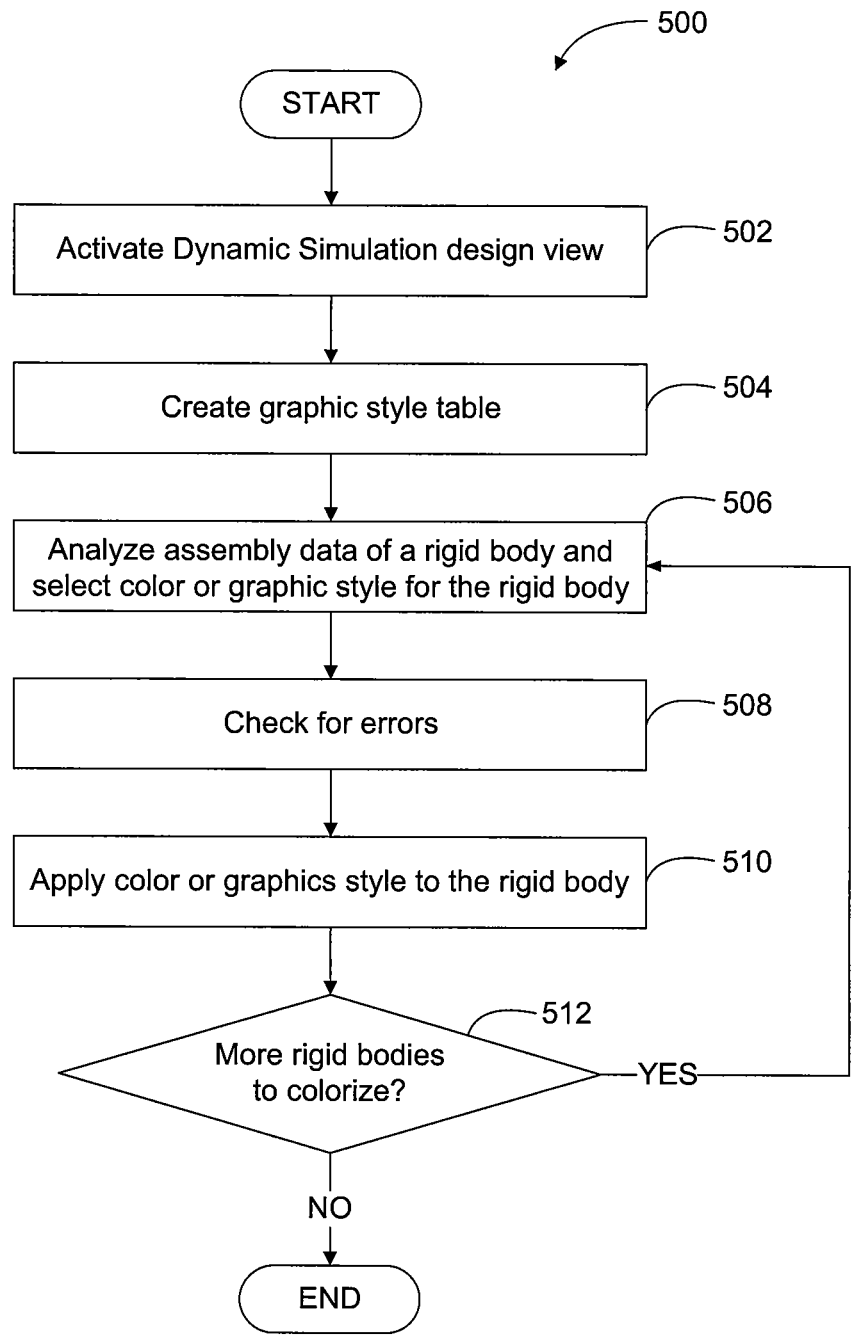
FIG. 5 is a flow diagram of method steps for visually delineating each rigid body in a CAD model, according to one embodiment of the invention.

FIG. 5 is a flow diagram of method steps for visually delineating each rigid body in a CAD model, according to one embodiment of the invention. Persons skilled in the art will understand that even though the method is described in conjunction with the systems of FIGS. 1-4 and 8, any system configured to perform the steps of the method of FIG. 5, in any order, is within the scope of the present invention.

As shown, the method 500 begins at step 502, where the CAD application activates a dynamic simulation view. As described above in conjunction with FIGS. 2-4, the rigid body definitions may be created in any technically feasible way, including manually or using a CRE. At step 504, the CAD application creates a graphic styles table. The graphics styles table includes a list of unique colors or graphic styles to be used for visually delineating rigid bodies in the assembly.

At step 506, the CAD application analyzes assembly data of a rigid body in the assembly and selects a color or graphics style for the rigid body. As described in greater detail in FIG. 6, the CAD application may analyze the assembly data of the rigid body to determine if the rigid body has any user-defined characteristics including whether the rigid body is grounded or whether the rigid body includes a style override. The color or graphic style selected for the rigid body may be chosen from the graphic style table created at step 504 or selected based on the style override, as described in greater detail herein.

At step 508, the CAD application checks for errors in the selection of a color or graphic style for the rigid body. In one embodiment, the CAD application may ensure that no two adjacent rigid bodies receive the same color or graphic style. In another embodiment, if a first color selected for a first rigid body is within a color threshold of a second color selected for an adjacent second rigid body, then the CAD application may select a different color from the graphics style table for the second rigid body. In another embodiment, when all available colors and graphic styles are exhausted from the graphics style table, the CAD application may begin reusing the colors and graphic styles, but with brightness or other visual characteristics modified.

At step 510, the CAD application applies the color or graphic style to the rigid body. The color or graphic style is applied to each component of the rigid body. At step 512, the CAD application determines if there are more rigid bodies in the model to colorize. If so, then the method returns to step 506, where steps 506-512 are repeated for the next rigid body.

Figure 6:
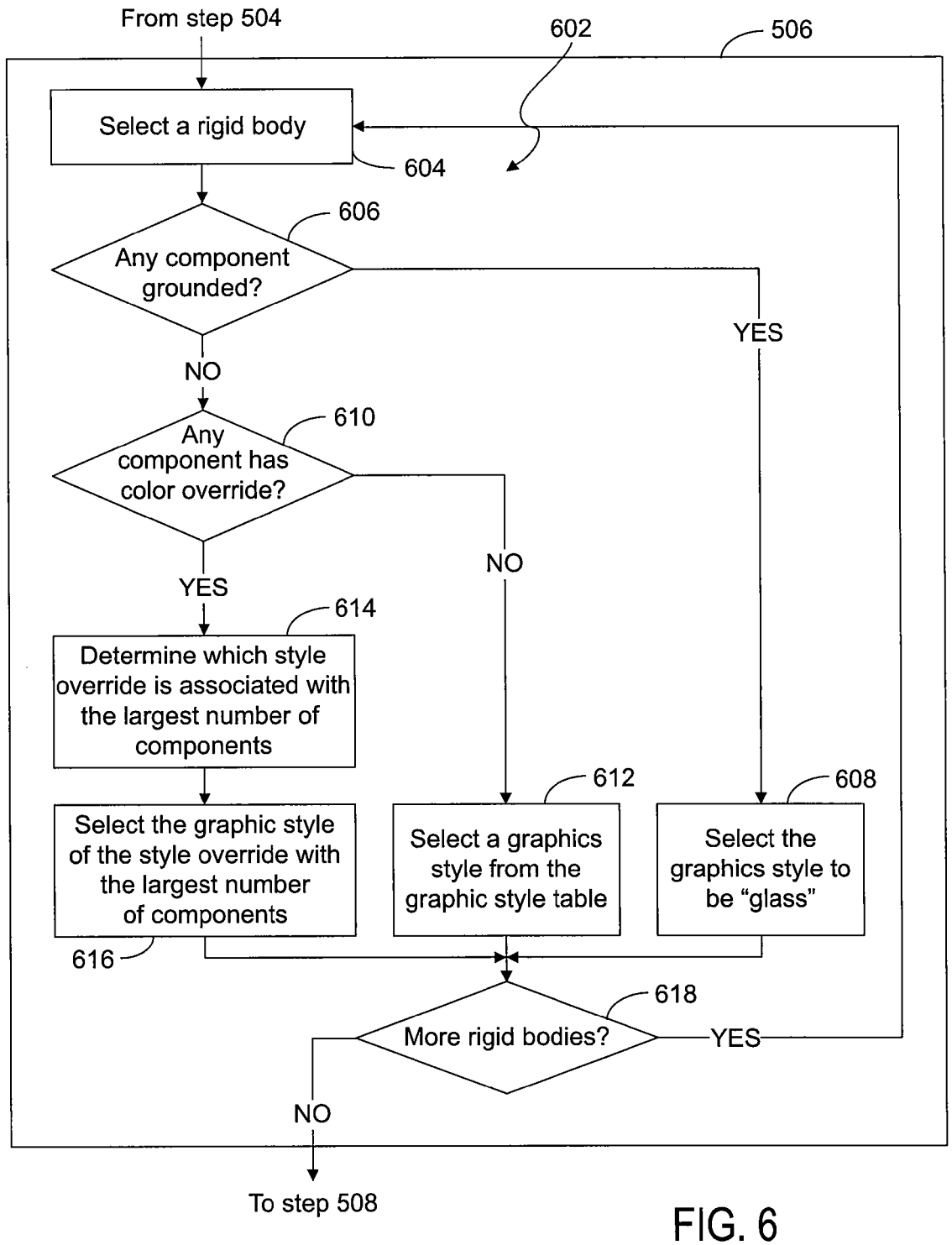
FIG. 6 is a flow diagram of method steps for analyzing assembly data to determine if a rigid body includes any user-defined characteristics, and selecting a color or graphic style for the rigid body, according to one embodiment of the invention.

FIG. 6 is a flow diagram of method steps for analyzing assembly data to determine if a rigid body includes any user-defined characteristics, and selecting a color or graphic style for the rigid body, according to one embodiment of the invention. Persons skilled in the art will understand that even though the method is described in conjunction with the systems of FIGS. 1-4 and 8, any system configured to perform the steps of the method of FIG. 6, in any order, is within the scope of the present invention. In one embodiment, the method 602 further delineates step 506 of FIG. 5.

As shown, the method 602 begins at step 604, where the CAD application selects a first rigid body of the assembly. At step 606, the CAD application determines if any component of the rigid body is grounded. Again, in one embodiment, the user may select which components are to be grounded using GUI elements in the assembly browser 100 of FIG. 1. As described above, rigid bodies that have no degrees of freedom with respect to the other rigid bodies in the assembly are deemed "grounded." If the CAD application determines that any component of the rigid body is grounded, then, at step 608, the CAD application selects a "glass" graphics style for the entire rigid body. In one embodiment, applying a glass graphics style to grounded rigid bodies assists with a user being able to more easily discern which rigid bodies are able to move relative to the ground and which cannot. After selecting the glass graphics style for a grounded rigid body, the method proceeds to step 618, where the CAD application determines if more rigid bodies are to be analyzed. If so, the method returns to step 602, and the next rigid body is analyzed. If no more rigid bodies need to be analyzed, then step 506 of FIG. 5 is complete, and the method 500 proceeds to step 508, as previously described herein.

Referring now to step 606, if no components of the rigid body are grounded, then, at step 610, the CAD application determines if any components of the rigid body have a style override. In one embodiment, a user may select a specific color or graphic style to be applied to a component of a rigid body in the assembly browser 100. In such a case, the CAD application respects the user selection by adhering to this style override in a dynamic simulation view.

In certain situations, a rigid body may be composed of two or more components that have been assigned different style overrides by the user. At step 614, the CAD application determines which style override is associated with the largest number of components of the rigid body. At step 616, the CAD application selects the graphics style associated with the style override associated with the largest number of components. For example, a rigid body may include five components, where two components have a red style override and three components have a green style override. At step 614, the CAD application determines that the green style override has the largest number of components (i.e., three) associated with that style override. At step 616, the CAD application selects the green graphics style for the rigid body because more components have a green style override than have a red style override. After selecting the graphics style associated with the style override with the largest number of components, the method proceeds to step 618, as previously described herein.

Returning now to step 610, if the CAD application determines that no components of the rigid body have a style override, then, at step 612, the CAD application selects a graphic style from the graphic style table. As described, the graphic style table contains a listing of available colors or graphic styles to be applied to non-grounded rigid bodies in the model. Again, in one embodiment, the CAD application selects a different color for each rigid body in the model. After selecting a unique color for the rigid body, the method proceeds to step 618, as previously described herein.

Figure 7:
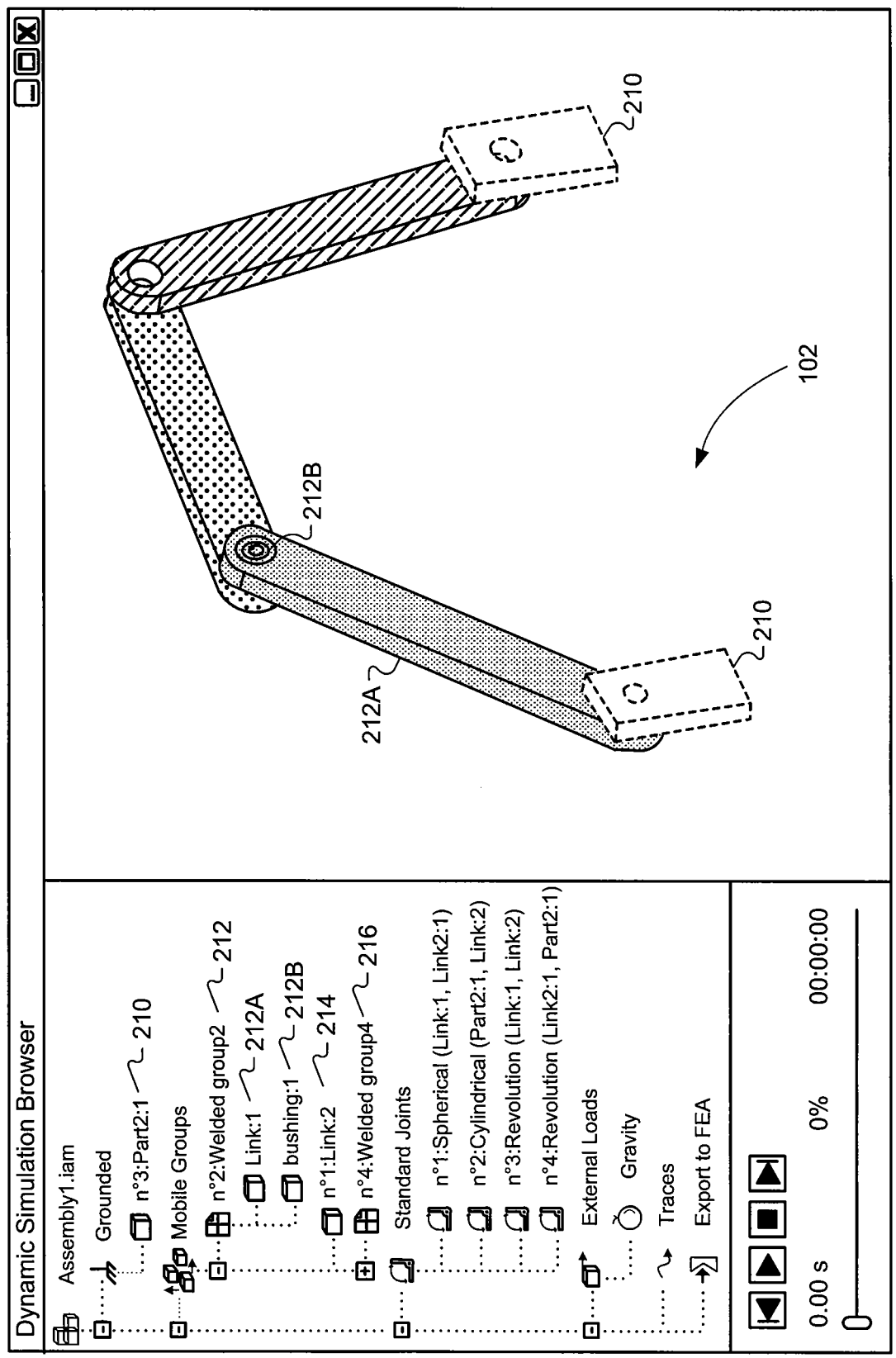
FIG. 7 is a screen shot illustrating a graphical user interface for a dynamic simulation browser of a CAD application visually delineating each rigid body in an assembly, according to one embodiment of the invention.

FIG. 7 is a screen shot illustrating a graphical user interface for a dynamic simulation browser of a CAD application visually delineating each rigid body in an assembly 102, according to one embodiment of the invention. As shown, the assembly 102 includes four rigid bodies 210, 212, 214, 216. A user has created the assembly 102 and initiated a command to visually delineating rigid bodies. As described above in FIGS. 1-4, rigid body 210 has no motion relative to ground; therefore, the CAD application is configured to assign a glass or transparent graphic style to rigid body 210, indicated by the dashed outlines of rigid body 210, to specially connote that the rigid body 210 is grounded. The remaining rigid bodies 212, 214, 216 are each assigned a unique graphic style by the CAD application. Rigid body 212 is assigned a fine-grained polka dot graphic style, rigid body 216 is assigned a coarse-grained polka dot graphic style, and rigid body 214 is assigned a cross-hatch graphic style. Again, the CAD application may ensure that no two adjacent rigid bodies receive the same color or graphic style.

Figure 8:
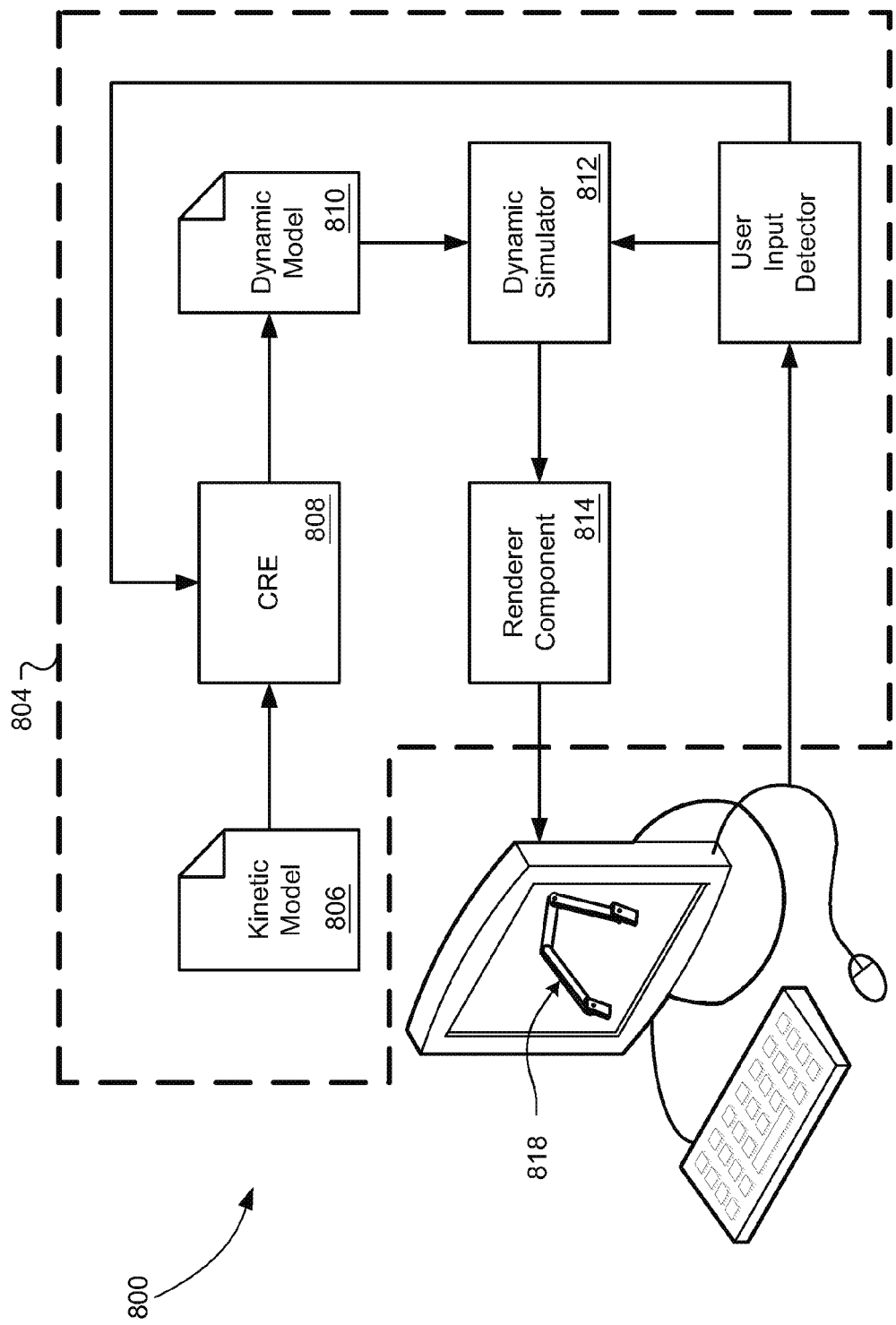
FIG. 8 is a conceptual illustration of a computing device configured to implement one or more aspects of the present invention.

FIG. 8 is a conceptual illustration of a computing system 800 configured to implement one or more aspects of the present invention. Computing system 800 can be any type of computing device such as, without limitation, a desktop computer, a server computer, a laptop computer, a tablet computer, a video game console, or a personal digital assistant, a cell phone, or the like. Computing system may further include a central processing unit (CPU), graphics processing unit (GPU), a main memory, and a local memory. The main memory and local memory may store a CAD application 804 configured for delineating rigid bodies in a CAD model. The CPU and GPU may be coupled to main memory and to the local memory and configured to execute instructions of the CAD application.

As shown, computing system 800 includes the CAD application 804 capable of executing therein. The CAD application 804, however, is not limited to any particular computing system and may be adapted to take advantage of new computing systems as they become available. Additionally, the CAD application 804 may be implemented as one or more software applications that execute on a single computer system or on distributed systems communicating over computer networks such as local area networks or large, wide area networks, such as the Internet. For example, a graphical user interface may include a software program executing on a client computer system at one physical location communicating with the CAD application 804 at another physical location.

A kinematic model 806 can store the kinematic information related to an assembly 818, such as information about geometric bodies and constraints. A Constraint Reduction Engine 808 can translate the kinematic information from the kinematic model 806 into dynamic information that can be stored in a dynamic model 810. For example, the dynamic model 810 can store information concerning joints, grounded groups, and mobile groups. In one embodiment, the dynamic model visually delineates the individual rigid bodies in the assembly 818. Logic within the CAD application 804 is configured to perform the methods of FIGS. 5 and 6 to delineate these rigid bodies with different graphics styles, as described herein. A dynamic simulator component 812 can apply loads and motion histories to the dynamic model 810, and a graphical display of the motion simulation can be displayed on the computer system 800 by a renderer component 814.

One advantage of the systems and methods described above is providing a better visual understanding of each rigid body in an assembly and the dynamic relationships between those rigid bodies. A second advantage is that a user may adjust any of the color choices for a component of a rigid body in an assembly browser, and the adjustment is respected when the design is re-analyzed in a dynamic simulation browser.

While the forgoing is directed to embodiments of the present invention, other and further embodiments of the invention may be devised without departing from the basic scope thereof. For example, aspects of the present invention may be implemented in hardware or software or in a combination of hardware and software. In addition, one embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention. Therefore, the scope of the present invention is determined by the claims that follow.

What is claimed is:

1. A method for delineating rigid bodies in a computer-aided design (CAD) model, the method comprising:
analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;
receiving an instruction to process a first identified rigid body;
creating a graphic style table that includes a listing of available graphic styles to apply to the one or more identified rigid bodies in the CAD model;
selecting a first graphic style by analyzing assembly data associated with the first identified rigid body to determine whether at least one geometric body of the first identified rigid body is associated with a user-defined grounded state;
if at least one geometric body of the first identified rigid body is associated with the user-defined grounded state, then selecting the first graphic style based on the assembly data, or
if no geometric bodies of the first identified rigid body are associated with the user-defined grounded state, then selecting the first graphic style from the graphic style table; and
applying the first graphic style to each of the one or more geometric bodies included in the first identified rigid body.

2. The method of claim 1, wherein selecting the first graphic style based on the assembly data comprises selecting a glass or transparent graphic style to apply to the first identified rigid body.

3. A method for delineating rigid bodies in a computer-aided design (CAD) model, the method comprising:
analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;
receiving an instruction to process a first identified rigid body;
creating a graphic style table that includes a listing of available graphic styles to apply to the one or more identified rigid bodies in the CAD model;
selecting a first graphic style by analyzing assembly data associated with the first identified rigid body to determine whether at least one geometric body of the first identified rigid body is associated with a user-defined style override;
if at least one geometric body of the first identified rigid body is associated with the user-defined style override, then selecting the first graphic style based on the assembly data, or
if no geometric bodies of the first identified rigid body are associated with the user-defined style override, then selecting the first graphic style from the graphic style table; and
applying the first graphic style to each of the one or more geometric bodies included in the first identified rigid body.

4. The method of claim 3, wherein selecting the first graphic style based on the assembly data comprises:
determining that a first style override is associated with the largest number of geometric bodies of the first identified rigid body; and
selecting a graphic style associated with the first style override.

5. A method for delineating rigid bodies in a computer-aided design (CAD) model, the method comprising:

analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;

receiving an instruction to process a first identified rigid body;

creating a graphic style table that includes a listing of available graphic styles to apply to the one or more identified rigid bodies in the CAD model;

selecting a first graphic style by analyzing assembly data associated with the first identified rigid body to determine whether at least one geometric body of the first identified rigid body is associated with a user-defined grounded state or a user-defined style override;

if at least one geometric body of the first identified rigid body is associated with the user-defined grounded state or the user-defined style override, then selecting the first graphic style based on the assembly data, or if no geometric bodies of the first identified rigid body are associated with the user-defined grounded state or the user-defined style override, then selecting the first graphic style from the graphic style table; and applying the first graphic style to each of the one or more geometric bodies included in the first identified rigid body.

6. The method of claim 5, further comprising:

selecting a second graphic style;

checking the selection of the second graphic style for errors; and applying the second graphic style to each of the one or more geometric bodies included in a second identified rigid body.

7. The method of claim 6, wherein checking the selection of the second graphic style for errors comprises:

determining whether the first graphic style is different from the second graphic style; and if the first graphic style is different from the second graphic style, determining that there is not an error, or if the first graphic style is not different from the second graphic style, determining that there is an error.

8. A non-transitory computer-readable storage medium storing instructions that when executed by a processor cause the processor to delineate rigid bodies in a computer-aided design (CAD) model, by performing steps comprising:

analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;

receiving an instruction to process a first identified rigid body;

creating a graphic style table that includes a listing of available graphic styles to apply to the one or more identified rigid bodies in the CAD model;

selecting a first graphic style by analyzing assembly data associated with the first identified rigid body to determine whether at least one geometric body of the first identified rigid body is associated with a user-defined grounded state;

if at least one geometric body of the first identified rigid body is associated with the user-defined grounded state, then selecting the first graphic style as a glass or transparent graphic style to apply to the first identified rigid body, or if no geometric bodies of the first identified rigid body are associated with the user-defined grounded state, then selecting the first graphic style from the graphic style table; and applying the first graphic style to each of the one or more geometric bodies included in the first identified rigid body.

9. A non-transitory computer-readable storage medium storing instructions that when executed by a processor cause the processor to delineate rigid bodies in a computer-aided design (CAD) model, by performing steps comprising:

analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;

receiving an instruction to process a first identified rigid body;

creating a graphic style table that includes a listing of available graphic styles to apply to the one or more identified rigid bodies in the CAD model;

selecting a first graphic style by analyzing assembly data associated with the first identified rigid body to determine whether at least one geometric body of the first identified rigid body is associated with a user-defined style override;

if at least one geometric body of the first identified rigid body is associated with the user-defined style override, then selecting the first graphic style based on the assembly data, or if no geometric bodies of the first identified rigid body are associated with the user-defined style override, then selecting the first graphic style from the graphic style table; and applying the first graphic style to each of the one or more geometric bodies included in the first identified rigid body.

10. The non-transitory computer-readable storage medium of claim 9, wherein selecting the first graphic style based on the assembly data comprises:

determining that a first style override is associated with the largest number of geometric bodies of the first identified rigid body; and selecting a graphic style associated with the first style override.

11. A non-transitory computer-readable storage medium storing instructions that when executed by a processor cause the processor to delineate rigid bodies in a computer-aided design (CAD) model, by performing steps comprising:

analyzing the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;

receiving an instruction to process a first identified rigid body;

creating a graphic style table that includes a listing of available graphic styles to apply to the one or more identified rigid bodies in the CAD model;

selecting a first graphic style by analyzing assembly data associated with the first identified rigid body to determine whether at least one geometric body of the first identified rigid body is associated with a user-defined grounded state or a user-defined style override;

if at least one geometric body of the first identified rigid body is associated with the user-defined grounded state or the user-defined style override, then selecting the first graphic style based on the assembly data, or if no geometric bodies of the first identified rigid body are associated with the user-defined grounded state or the user-defined style override, then selecting the first graphic style from the graphic style table; and applying the first graphic style to each of the one or more geometric bodies included in the first identified rigid body.

12. The non-transitory computer-readable storage medium of claim 11, further comprising:

selecting a second graphic style;

checking the selection of the second graphic style for errors; and applying the second graphic style to each of the one or more geometric bodies included in a second identified rigid body.

13. The non-transitory computer-readable storage medium of claim 12, wherein checking the selection of the second graphic style for errors comprises:

determining whether the first graphic style is different from the second graphic style; and if the first graphic style is different from the second graphic style, determining that there is not an error, or if the first graphic style is not different from the second graphic style, determining that there is an error.

14. A computing system configured to delineate rigid bodies in a computer-aided design (CAD) model, the system comprising:

a memory configured to store program instructions;

a processor configured to execute the program instructions; and an application stored in the memory and, when executed by the processor, configured to cause the processor to execute steps comprising:

analyze the CAD model to identify one or more rigid bodies based on the number of relative degrees of freedom between any two geometric bodies included in the CAD model, wherein each identified rigid body includes one or more geometric bodies that have no degrees of freedom relative to any of the other geometric bodies included in the rigid body;

receive an instruction to process a first identified rigid body;

create a graphic style table that includes a listing of available graphic styles to apply to the one or more identified rigid bodies in the CAD model;

select a first graphic style by analyzing assembly data associated with the first identified rigid body to determine whether at least one geometric body of the first identified rigid body is associated with a user-defined grounded state or a user-defined style override;

if at least one geometric body of the first identified rigid body is associated with the user-defined grounded state or the user-defined style override, then selecting the first graphic style based on the assembly data, or if no geometric bodies of the first identified rigid body are associated with the user-defined grounded state or the user-defined style override, then selecting the first graphic style from the graphic style table; and apply the first graphic style to each of the one or more geometric bodies included in the first identified rigid body.

* * * * *